United States Patent
Fremgen, Jr. et al.

(10) Patent No.: US 6,225,747 B1
(45) Date of Patent: *May 1, 2001

(54) CHARGED-PARTICLE SOURCE, CONTROL SYSTEM AND PROCESS USING GATING TO EXTRACT THE CHARGED PARTICLE BEAM

(75) Inventors: Roger P. Fremgen, Jr., East Northport; John Jacob, Brooklyn; Alan V. Hayes, Centerport; Victor Kanarov, Bellemore; Edward W. Ostan, Huntington; Abraham J. Navy, Bellerose; Emmanuel N. Lakios, Mt. Sinai; Genrikh Treyger, Brooklyn, all of NY (US)

(73) Assignee: Veeco Instruments Inc., Plainview, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/371,061

(22) Filed: Aug. 9, 1999

Related U.S. Application Data

(63) Continuation of application No. 08/883,696, filed on Jun. 27, 1997, now Pat. No. 5,982,101.

(51) Int. Cl.⁷ .................. H01J 27/02; H05H 1/24
(52) U.S. Cl. .................. 315/111.91; 315/111.21
(58) Field of Search .................. 315/111.21, 111.31, 315/111.81, 111.91; 250/423 R, 424, 492.21, 492.3

(56) References Cited

U.S. PATENT DOCUMENTS

| | | | |
|---|---|---|---|
| 4,759,948 | 7/1988 | Hashimoto et al. | 427/38 |
| 4,870,284 | * 9/1989 | Hashimoto et al. | 250/423 R |
| 5,097,179 | 3/1992 | Takayama | 315/111.81 |
| 5,442,185 | * 8/1995 | Chan | 250/492.21 |
| 5,444,259 | 8/1995 | Ohmi | 250/452.21 |
| 5,556,521 | 9/1996 | Ghanbari | 204/192.32 |
| 5,982,101 | * 11/1999 | Fremgen, Jr. et al. | 315/111.91 |

OTHER PUBLICATIONS

European Search Report, Mailed Oct. 22, 1998 on PCT/US98/12915.

* cited by examiner

*Primary Examiner*—Justin P. Bettendorf
(74) *Attorney, Agent, or Firm*—Morgan & Finnegan LLP

(57) ABSTRACT

A control system and process for operating a charged-particle source which achieves gating of the charged-particle beam without a mechanical shutter and with very short transition between the beam "on" and beam "off" states is presented. The process and control system provide very precise control of the duration of the charged-particle extraction.

20 Claims, 16 Drawing Sheets

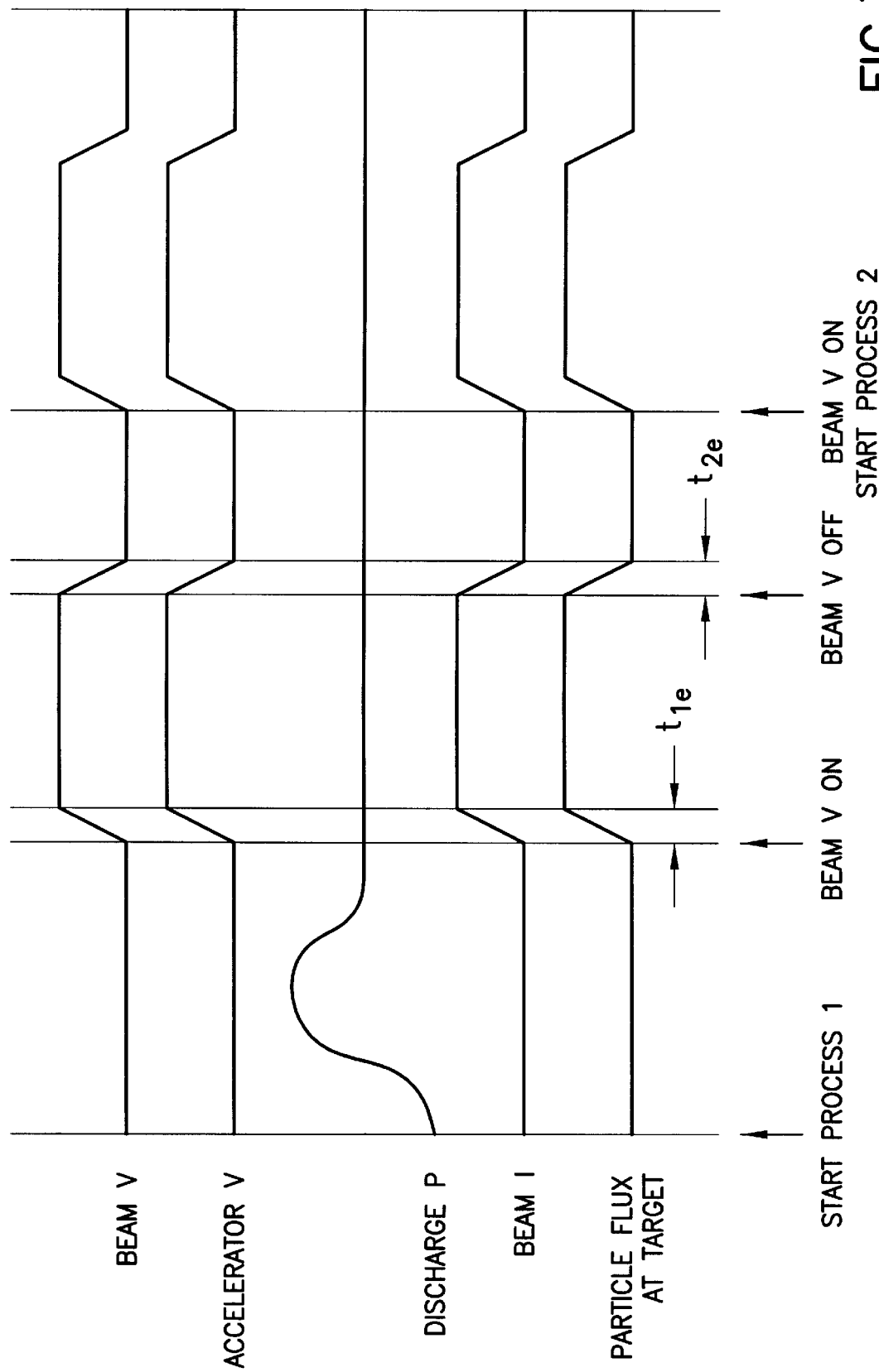

CHARGED-PARTICLE SOURCE, CONTROL SYSTEM AND PROCESS USING GATING TO EXTRACT THE CHARGED PARTICLE BEAM

This is a continuation of application Ser. No. 08/883,696 filed Jun. 27, 1997 now U.S. Pat. No. 5,982,101.

FIELD OF THE INVENTION

The invention relates to charged-particle sources including broad-beam ion sources for ion beam deposition and etching, and electron sources for surface modification. The invention relates more particularly to a control system and process for operating a charged-particle source.

BACKGROUND OF THE INVENTION

Charged-particle sources are used for various surface modification, etching, and deposition applications, and are particularly advantageous compared to other methods for providing direct control of particle energy and flux, angle of incidence to the target, and isolation of the target substrate, if different from the conditions of the reactor used to generate the etching and or depositing species.

Broad-beam ion sources have numerous applications in microelectronics device fabrication. Ion beam equipment is used, for example, in the production of multilayer optical coatings, thin-film magnetic heads and in various areas of semiconductor and optical device manufacture.

Charged-particle sources are particularly advantageous for etching and/or deposition of very thin high-quality films over a large uniform area. This is an application of increasing importance as semiconductor and magnetic memory devices advance to higher capacities and device geometries shrink.

An example of a critical large area thin film deposition process is the production of an extreme ultraviolet (EUV) reticles for use in manufacturing photomasks for ultra large scaled integrated circuits. This application requires deposition of a thin film stack of over 80 layers of alternating elements A and B having contrasting indices of refraction, such as Mo and Si, each layer consisting of a few atomic layers of element A or element B. The optical quality of the multilayer reflector is critical. Therefore the thickness of each elemental layer must be very well controlled and repeatable from the first layer to the last to within 0.01 nm. Also, the avoidance of atomic contamination and particulate defects is crucial.

An example of a challenging etching process is the patterning of giant magnetoresistive (GMR) read elements in the wafer processing stage of manufacture of a GMR thin film magnetic recording head or magnetic memory circuit. Such devices are composed of at least several different layers of magnetic and nonmagnetic materials, such as Co and Cu. The performance of the device, i.e. its magnetoresistance, is sensitive to a difference of less than one atomic layer of thickness. To pattern the device without damage requires control of the etch rate of the material to less than 10 nm/min.

To illustrate the level of control of process time which is required, consider deposition of a 2.5 nm film at a deposition rate of 0.1 nm/sec. The deposition time is 25 seconds. Therefore a control error of +/−1 second causes a variation of 2/25=4% in the film thickness. For the EUV mirror application described above, this is unacceptable.

The processes described above are currently being carried out mainly by direct plasma and ion beam deposition and etching techniques. The advantages of ion beam and other charged-particle sources for such applications include the ability to isolate the substrate from plasma-generated particles, provide a controlled and measurable dose of sputtered particles, and to maintain the substrate at a low pressure, for higher film purity in the process chamber where the substrate is located.

One limitation of charged-particle sources of the prior art in these applications is the lack of precise control in the starting, stopping, and duration of the charged-particle flux and particle energies. Source turn-on and adjustment of the discharge power to the desired value requires a few seconds, turn-off requires at least a few hundred milliseconds rampdown, and the duration of the process itself may very by at least 1 second due to slightly irreproducible software loops in conventional computer-automated control equipment. During the turn-on and turn-off periods the particle energy and flux on the target are not fully under control, which can lead to irreproducible process results. These transition problems can be prevented to some extent by interposing a mechanical shutter between the charged-particle source and the target. The operation sequence with a mechanical shutter may be described as follows:

input the desired preset process time through the software;
turn on the source (with mechanical shutter closed) allow beam to stabilize (e.g. by monitoring the "beam current" on the beam power supply);
open the mechanical shutter, start timer;
when the elapsed time reaches the preset process time, close the mechanical shutter and/or shut down the power supplies.

Although the use of a mechanical shutter can reduce the variation in the beam current and energy on the target during the start-up process as compared to simply turning the power supplies on and off, it does not reduce the error in controlling the duration of the process time, and introduces other disadvantages. These disadvantages include:

1. Mechanical shutters in deposition or etch systems build up contamination on the surface, e.g. from sputtered material coming off of the target, and during the shutter motion may shed this contamination on the target or substrate. This can be minimized by slowing the acceleration or deceleration of the shutter, but at the possible expense of etch or deposition uniformity, as described below.

2. Mechanical shutters typically require 1–3 seconds or more to move from a fully open to a fully closed position or vice versa; during the transition period, for a target shutter for example, some portion of the charged-particle flux still reaches the target. This will change the distribution of the charged-particle beam on the target for the transition period and, for very short processes, could cause nonuniformity of deposition or etching on the target. Also during this period, the charged-particle beam is impinging on the edge of the shutter, which could cause contamination of the target by material from the edge of the shutter. All these effects can be reduced somewhat by using high-speed and high-acceleration/deceleration shutters, however at the cost of generating higher levels of particulates in the chamber and perhaps on the substrate (see above discussion).

3. During the time that the mechanical shutter is closed and the source is on, the charged-particle beam is directly impinging on the shutter; this will result in material being sputtered from the shutter and being deposited inside the source and onto the ion optic assembly. This can result in more frequent required maintenance of the source and increased particulate contamination from flaking of deposited material.

4. There is typically a higher pressure in the ion source with the mechanical shutter closed than with it open, since most of the process gas is introduced directly into the source while the vacuum pump is located on the process chamber outside of the source. When the shutter opens, the pressure change can cause a fluctuation in the ion beam current.

5. The incorporation of a mechanical control assembly in the process system involves significant cost and dependence on such a shutter reduces reliability; mechanical shutters are difficult to maintain in a vacuum system, particularly in etch or deposition systems where deposits can build up between moving parts and cause shutter positioning failure or motor damage.

SUMMARY OF THE INVENTION

From the foregoing it is clear that there is a need to provide a charged-particle source and control system with a means of starting and stopping beam extraction without a mechanical shutter and with very short transition between the beam "on" and beam "off" states. Furthermore, it is clear that there is a need to provide a charged-particle source and control system with means of very precise control of the duration of the charged-particle extraction.

It is an object of this invention to provide a method for "gating" a charged-particle source which can precisely regulate the dosage and energy of a charged-particle beam on a target without interposing at any time a physical barrier between the source and the target.

It is a further object of the present invention to provide a charged-particle source and control system with means to operate the above-described "shutter" in a way to minimize the transition time between a stable "beam-on" state and a completely "off" state.

It is another object of this invention to provide a charged-particle source and control system incorporating means to precisely control the duration time of charged-particle beam extraction.

The first object of the invention can be achieved according to the present invention by using the beam voltage control to gate the beam "on" or "off." The charged-particle beam cannot be effectively extracted from the source as long as the discharge plasma in the source is at the same electrical potential as the surroundings. This is because the plasma is mechanically or electromagnetically confined in the source by the ion optics unless there is an electromagnetic field generated in such a manner to allow extraction of particles of one charge or the other through the ion optics. Even if a current of charged particles can be extracted, with no beam voltage the particle energy is very limited, and below the threshold required to effectively etch the target. Therefore, the beam voltage control can be used as a "electrostatic shutter" to turn the charged-particle beam on or off independent of the discharge power condition. The method of operation is, in general, as follows:

input the desired preset process time through the software;

turn on the discharge power to the source with the beam voltage off or, preferably, set to a programmed input of 0; allow the discharge to stabilize;

turn "on" the beam voltage, starting extraction of the charged-particle beam; start counting the time;

when the count reaches the preset process time, turn "off" the beam voltage, stopping extraction of the charged-particle beam.

The second object of the invention can be achieved according to the present invention by including in the control system of the beam voltage power supply a particular electronic circuit which utilizes high-speed switches to change the input signal to the power supply, and when the beam is to be shut off, directly grounds the input to the beam power supplies, thereby shorting capacitive elements which would otherwise cause a delayed decrease in supply voltage, and hence prolonged charged-particle beam extraction.

The third object of the invention can be achieved according to the present invention by including in the control system of the beam voltage power supply a particular electronic circuit which precisely regulates the operation time, by counting pulses from a precise time base.

BRIEF DESCRIPTION OF THE DRAWINGS

FIG. 3E is a timing diagram illustrating the response of the particle flux collected on the target for particle source operation with another electrostatic shutter operated with a standard control system.

DETAILED DESCRIPTION OF THE INVENTION

Figure 1:
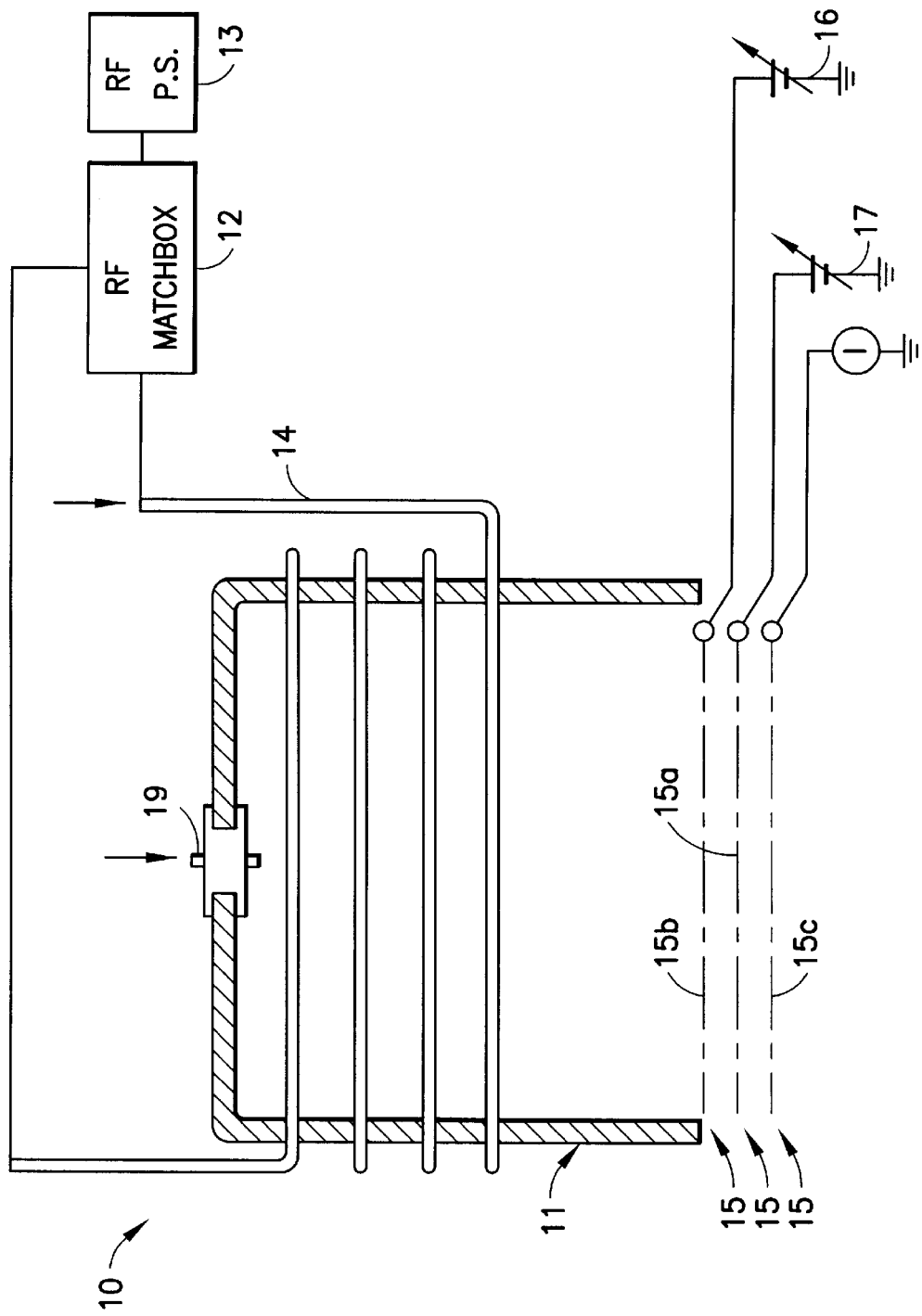
FIG. 1 is a schematic diagram illustrating an inductively coupled RF ion beam source.

FIG. 1 is a schematic diagram illustrating an inductively coupled RF ion beam source known in the prior art. This depiction is for illustrative purposes only. The invention contemplates the use of other types of charged-particle sources, including DC or "Kaufman" ion sources, other types of RF ion sources, broad-beam electron sources, negative ion sources, and others which are known to persons skilled in the art and need not be described in detail. Ion sources, power supplies, and controllers are discussed in "Veeco Cluster Tool Manual," available from Veeco Instruments, Inc., Plainview, N.Y. which is incorporated by reference herein along with the references contained therein. A class of ion sources known as "gridless" sources differ from the example in FIG. 1 in that they do not mechanically restrict the plasma, but rather use magnetic plasma confinement. However, they employ a beam voltage control which is analogous to the beam voltage control described below. Other charged-particle sources may be conceived where the particle acceleration means employs magnetic rather than electric fields.

As shown in FIG. 1, an inductively coupled RF charged-particle source 10 typically includes a plasma discharge vessel 11 which may be made of quartz. The source 10 further includes an RF matchbox 12, an RF power supply 13 connectable to the matchbox and an RF applicator or energy generator 14 which is depicted in FIG. 1 as a water-cooled RF induction coil. Coil 14 is connected to matchbox 12, and as illustrated, vessel 11 is disposed within coil 14.

The source 10 further includes a multihole three grid electrode or ion optics assembly 15 which substantially contains the plasma within discharge vessel 11 and controls the extraction of ions from the vessel. A first grid 15(a), commonly termed the "accelerator", is connectable to a negative voltage supply 17 capable of providing a wide variety of voltage levels, including, for example, high voltage levels. For our purposes, high voltage is defined as any voltage having an absolute magnitude greater than 50. The grid 15(a) includes a plurality of apertures configured in known fashion to optimize confinement of the plasma within plasma vessel 11 while allowing and, in part, directing the extraction of ions from the plasma. In this depiction, grid 15(b) is disposed between the plasma and the accelerator grid. It is shown as a conductive electrode which is connected to a positive voltage ion beam power supply 16 capable of providing a wide variety of voltage levels, including, for example, high voltage levels. Thus, grid electrode 15(b) is the electrode which controls the potential of the plasma, which is also effectively the "beam voltage". Ions are extracted from the plasma through the ion optics assembly 15. To maintain quasi-neutrality of the ionized plasma an equivalent number of electrons to the number of ions being extracted should be removed from the plasma. These electrons are collected on the "screen" grid 15(b) in this example and flow through the beam power supply, causing a indicated "beam current" reading.

A third grid 15(c), known as the "decelerator" is at electrical ground potential. A neutralizer (not shown) supplies low energy electrons to the ion beam to neutralize the positive space charge. Working gas is provided inside of the source through an inlet 19. In alternative embodiments of this charged-particle source, conductive elements in contact with the plasma other than the screen grid may be employed as the electrode that is connected to the beam power supply and is used to control the plasma and the beam potentials. In these cases, the screen grid 15(b) can be coated with a nonconductive material.

The illustrated particle source configuration has particular benefits with regard to the purposes of the subject invention and has been found to produce extremely accurately controlled etch and deposition processes, and also had other benefits (such as very low contamination levels) which are also significant to the applications for which the invention is required. The stability of the discharge and discharge efficiency, the ease of tuning the RF, and adjusting the discharge power level are several features of this source which directly enhance the goals of the invention. It should be understood, however, that the control methods and enhanced control system which are the subject of the invention can be employed with other particle sources.

Figure 2A:
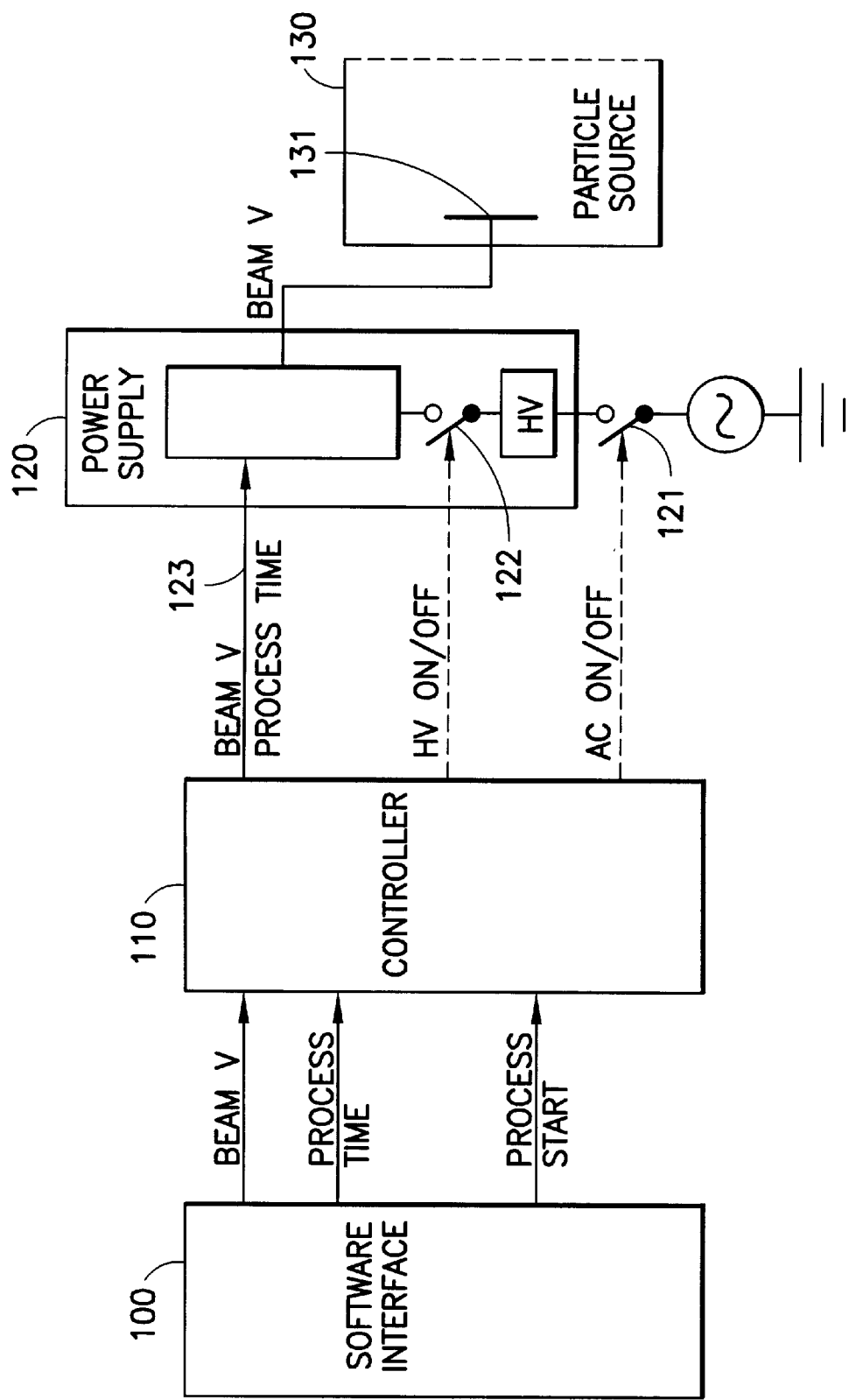
FIG. 2A is a schematic diagram of a standard control system for a beam power supply.

FIG. 2A is a schematic diagram of the standard control system for the beam power supply. For the sake of clarity, only those elements necessary to the description of the invention are illustrated. As shown in FIG. 2A, the control settings are programmed into the controller 110 through the software interface 100, and are translated to the power supply 120 as a specific set of electrical inputs. The power supply, in turn, provides a voltage signal to the electrode 131 controlling the electric potential of the particle source 130. The software inputs include, for example, the voltage setting of the grids, the duration of time that the ion source is to be energized, and the process sequence which will establish the time that the process is to be started. The electrical inputs to the power supply from the controller are: the settings of the on/off switches for the main power 121 and high voltage (HV) 122, and an analog signal 123 which is directly proportional to the voltage setting of the power supply.

Figure 7:
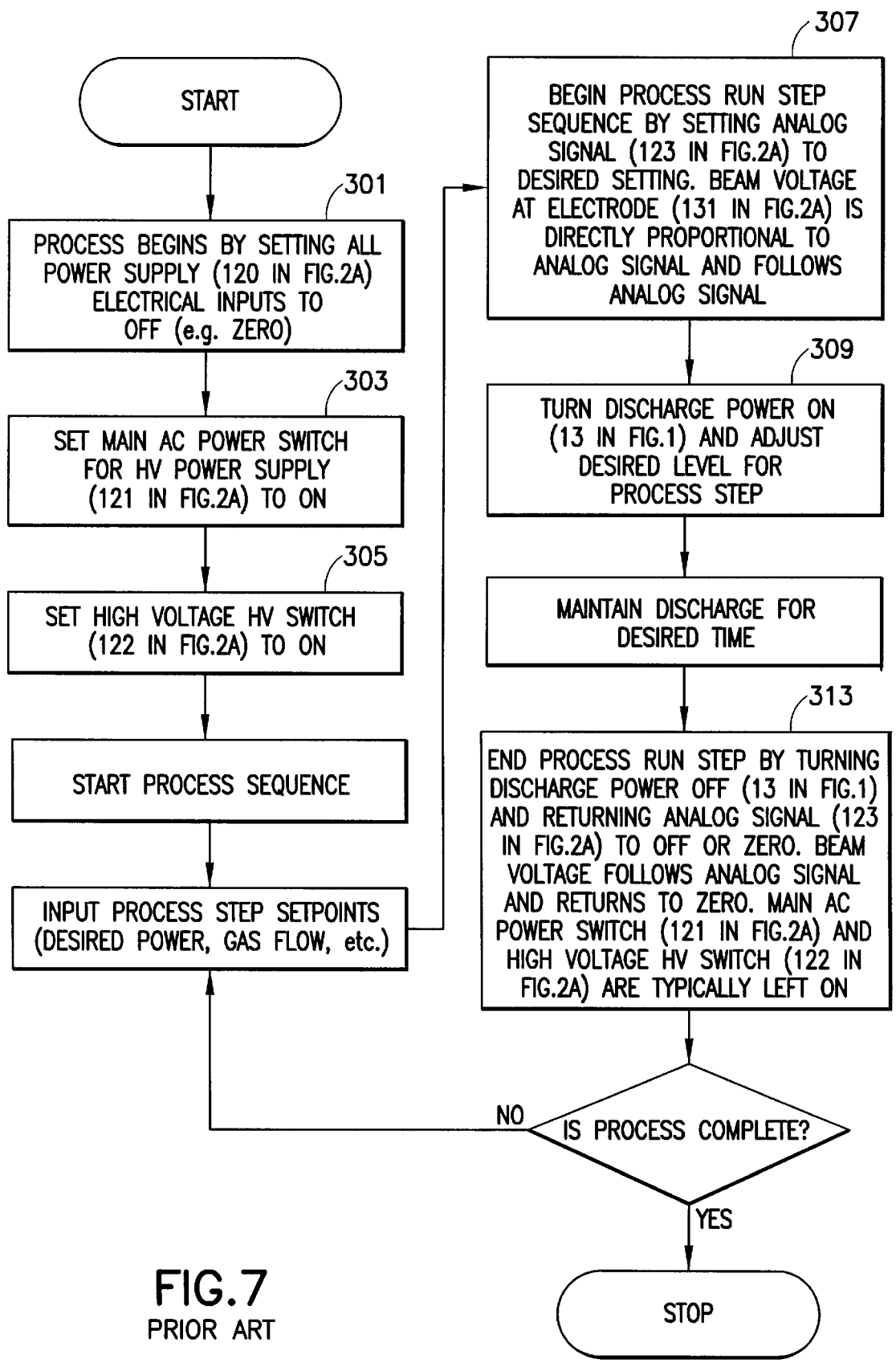
FIG. 7 depicts the process flow of the prior art standard control system of FIG. 2A.

Referring to FIGS. 1, 2A and 7, operation of this control system by the method of the prior art is carried out as follows: initially all electrical inputs to the power supply (120 in FIG. 2A) are set to zero (or "off") (301 in FIG. 7); a signal to switch 121 (in FIG. 2A) is sent to turn on the main (AC) power (303 in FIG. 7 for HV supply); a signal to switch 122 (in FIG. 2A) is sent to turn on the high voltage (HV) (305 in FIG. 7); when the process sequence is initiated by the controller, the analog signal (123 in FIG. 2A) (and thus the beam voltage) is raised to the desired setting for the run (307 in FIG. 7); the discharge power (13 in FIG. 1) is then turned on (309 in FIG. 7) and the beam current will rise and stabilize; when the process run step is completed (313 in FIG. 7), the discharge power (13 in FIG. 1) is shut off and the beam voltage signal (123 in FIG. 2A) is returned to zero; for a multistep process switches 122 and 121 (in FIG. 2A) are typically left on between process run steps.

Figure 3A:
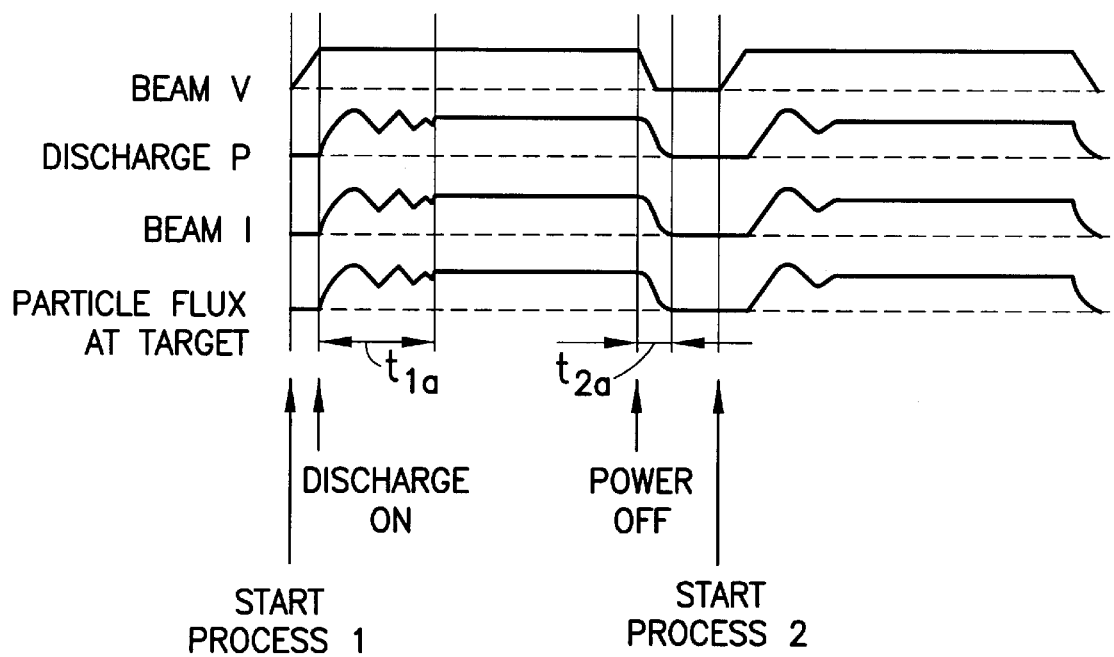
FIG. 3A is a timing diagram illustrating the response of the particle flux collected on the target for particle source operation without a mechanical shutter.

FIG. 3A is a timing diagram which illustrates the response of the particle flux collected on the target for particle source operation by the method of the prior art without a mechanical shutter. It also shows the timing characteristics of the beam voltage, discharge power, and beam current in order to elucidate the response of the particle flux. It can be seen that the particle flux at the target varies in the beginning of the process and at the end of the process, which we characterize in terms of the "rise time" $t_{1a}$ and "decay time" $t_{2a}$, respectively. The key factor determining the "rise" time $t_{1a}$ in this case is the initiation and stabilization of the discharge power. The ramp-up time for the beam voltage, determined by the beam power supply electronics, is not important since the plasma is not on during the ramping-up operation.

For critical processes, such as the subject of this invention, the control system should also monitor the flux of the charged-particle output from the particle source and adjust the discharge power by a feedback loop to ensure that the particle flux output is at the desired level. In this way, any changes in the efficiency of the particle source (relationship between discharge power and charged-particle flux) will not result in changes in the target current.

A convenient method of doing this is to monitor the beam current. Since the current density is the flux times charge, the beam current is proportionate to the flux on the target provided that the distribution of the beam flux is repeatable (usually a good practical assumption). Other methods, such as target current measurement, or use of a Faraday cup downstream of the ion source, are also available. For the purposes of this discussion, we will assume that constant beam current control is used. The feedback control is accomplished preferentially by software methods for maximum flexibility. This flexibility is important to avoid electrical instabilities in the particle source (e.g. arcing) which can cause the charged-particle flux output and particle energy (related to beam voltage) to fluctuate, perhaps uncontrollably.

This feedback control system seriously impacts the rise time of the discharge power and, in this case, the rise time of the particle flux on the target. To minimize the number and extent of the adjustments, the initial setpoint of the discharge power is set to approximate, preferably as closely as possible, the actual desired power level. In this condition the net discharge stabilization time now has two major components; first, there is the initial discharge circuit response time, i.e. the time required for the new plasma discharge level to stabilize at the initial set level; second, there is the time required to monitor the charged-particle flux and reprogram the setpoint. This may be done in increments to minimize the average seek time. An additional factor is the discharge circuit response time between each of the incremental adjustments. The initial discharge circuit response for an RF particle source is the time required for tuning the RF circuit, which is typically on the order of a few seconds using a high-speed auto tuning circuit. For a common DC filament type ion source, it is the time required to heat up the filament and the discharge power supplies and is usually longer than that. The feedback control loop requires an additional several seconds. It is important to note also that the variation in the discharge power, and consequently, in this case, the charged-particle flux on the surface, is not very reproducible.

The "decay" time of the particle flux on the target current depends on the "ramp-down" times of the discharge and beam voltage power supplies, but can be limited to about 0.15 seconds by routine methods.

Figure 3B:
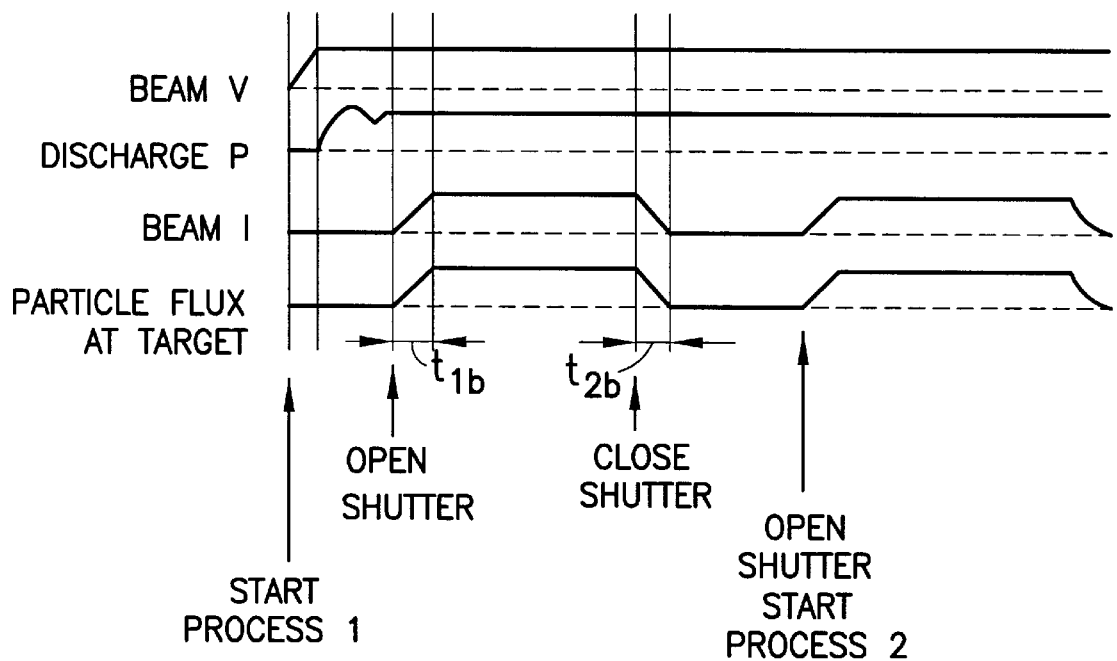
FIG. 3B is a timing diagram illustrating the response of the particle flux collected on the target for particle source operation with a mechanical shutter.

In FIG. 3B, the particle flux on the target is considered with the use of a mechanical shutter. Now the particle flux rise time "$t_{1b}$" is determined only by the time required to adjust the shutter from closed to open position. However, as discussed above, minimization of this time is limited by considerations such as particle contamination of the target, etc. by strong acceleration and deceleration of the shutter. Assuming that the mechanical shutter is also used to stop the process, the decay time "$t_{2b}$" is also on the order of several seconds. In this mode the discharge and beam V may be left on between process steps. Alternatively, the beam V can be shut off at the end of each process, which would reduce the decay time to the value given in the description on FIG. 3A.

In one embodiment of the invention, the standard control circuit is employed but the beam voltage control is used to electrostatically "gate" the ion beam. The effect on the particle flux to the target is shown schematically in FIG. 3C, using the flow chart in FIG. 8. In this case the discharge power is turned on (401 in FIG. 8) and stabilized prior to energizing the particle beam. Since there is no beam voltage, the energy of any particles which might escape from the ion source is below the threshold required to cause etching of the target. For an ion source with a multigrid ion optic assembly such as the one described in FIG. 1 there usually is no significant particle flux on the target extracted from the ion source at this time, although a small "indicated" beam current reading may be registered, which just reflects the loss of some charged-particles to the accelerator grid.

Now the "rise time" of the particle flux on the target is limited by the ramp-up time of the beam power supply. If the beam voltage level is preset (403 in FIG. 8) and the HV switch (labeled 122 in FIG. 2A) is used to gate the beam (405 in FIG. 8), the rise time ("$t_{1c}$" in FIG. 3C) is on the order of about 0.5 seconds. As illustrated in FIGS. 2 and 3, the main AC switch for the high voltage supply, 121 in FIG. 2A, is turned on prior to operating the HV switch.

Figure 8:
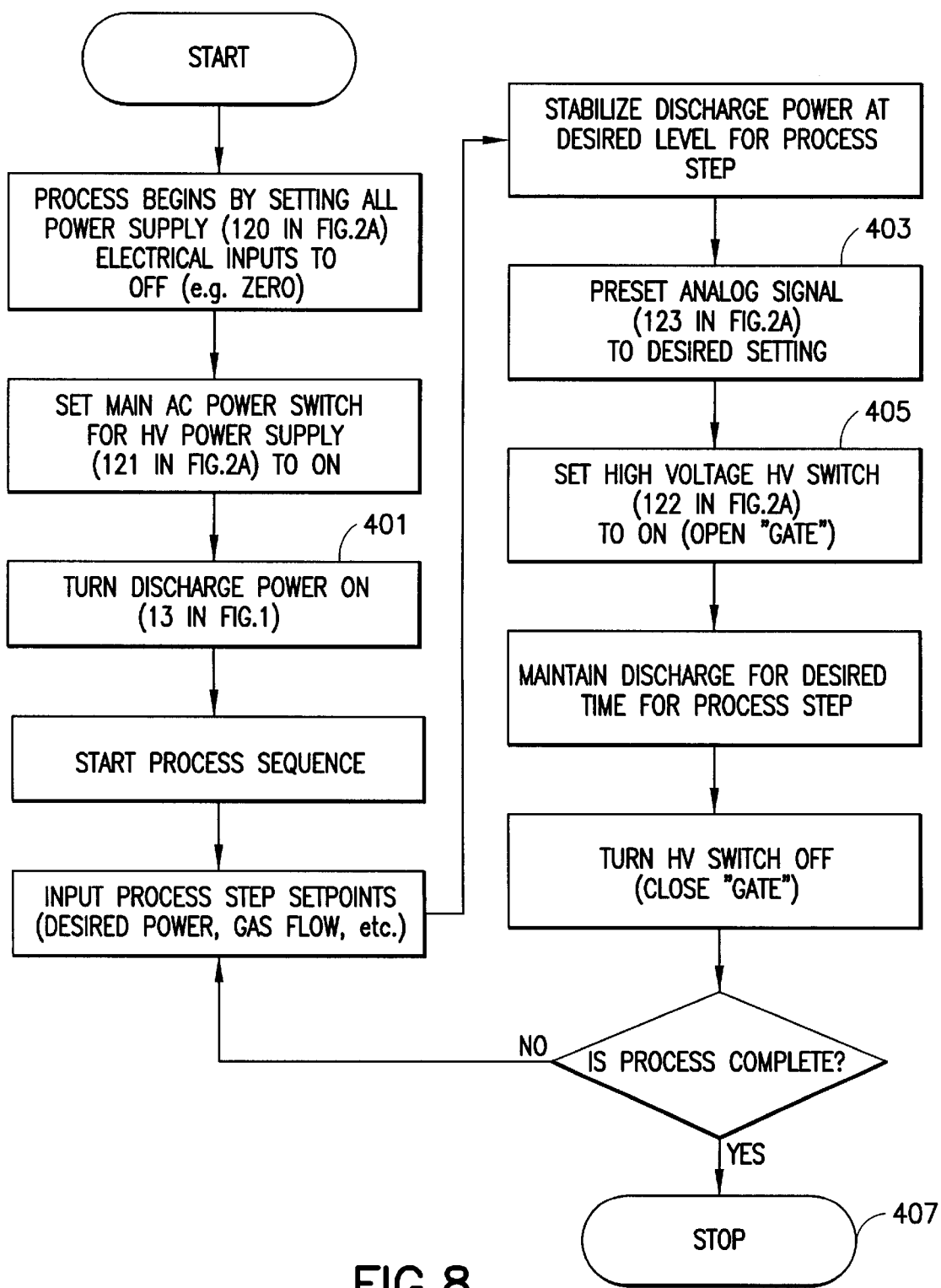
FIG. 8 depicts the process flow of an electrostatic shutter using the standard control system of FIG. 2A.

The "decay time" of the particle flux on the target ("$t_{2c}$" in FIG. 3C) is limited by the turn-off time of the voltage power supply (407 in FIG. 8). As described in reference to FIG. 3A, this time is about 0.15 seconds.

Figure 9:
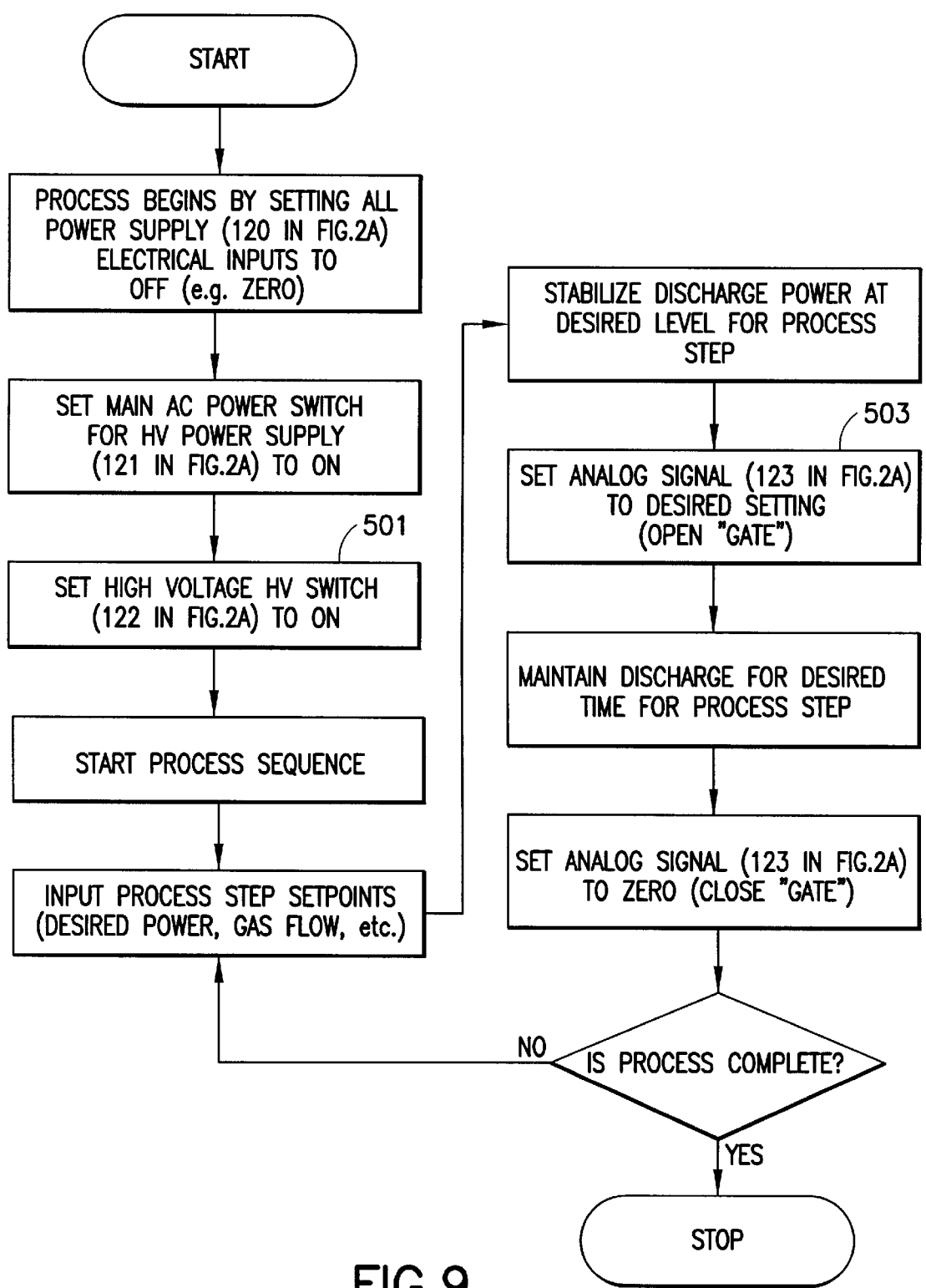
FIG. 9 depicts the process flow of an electrostatic shutter using the standard control system of FIG. 2A.

Referring to FIGS. 2A and 9, in a more preferred embodiment of the process the HV switch 122 is turned "on" (501 in FIG. 9) with the analog signal 123 set to 0 volts, and this signal is then adjusted to the preset programmed value (503 in FIG. 9), which gates the output flux. Under these conditions, the "rise time" $t_{1c}$ can be reduced to less than 0.2 seconds. It should be noted that the etching rate of the target is actually proportionate to the product of the charged-particle current and voltage, i.e. power, rather than just to the current alone. Therefore, the actual transition times for the target etching in this invention are reduced compared to the transition times for just the current because in the transition stage both the voltage and current are lower than during the stable period.

Figure 11:
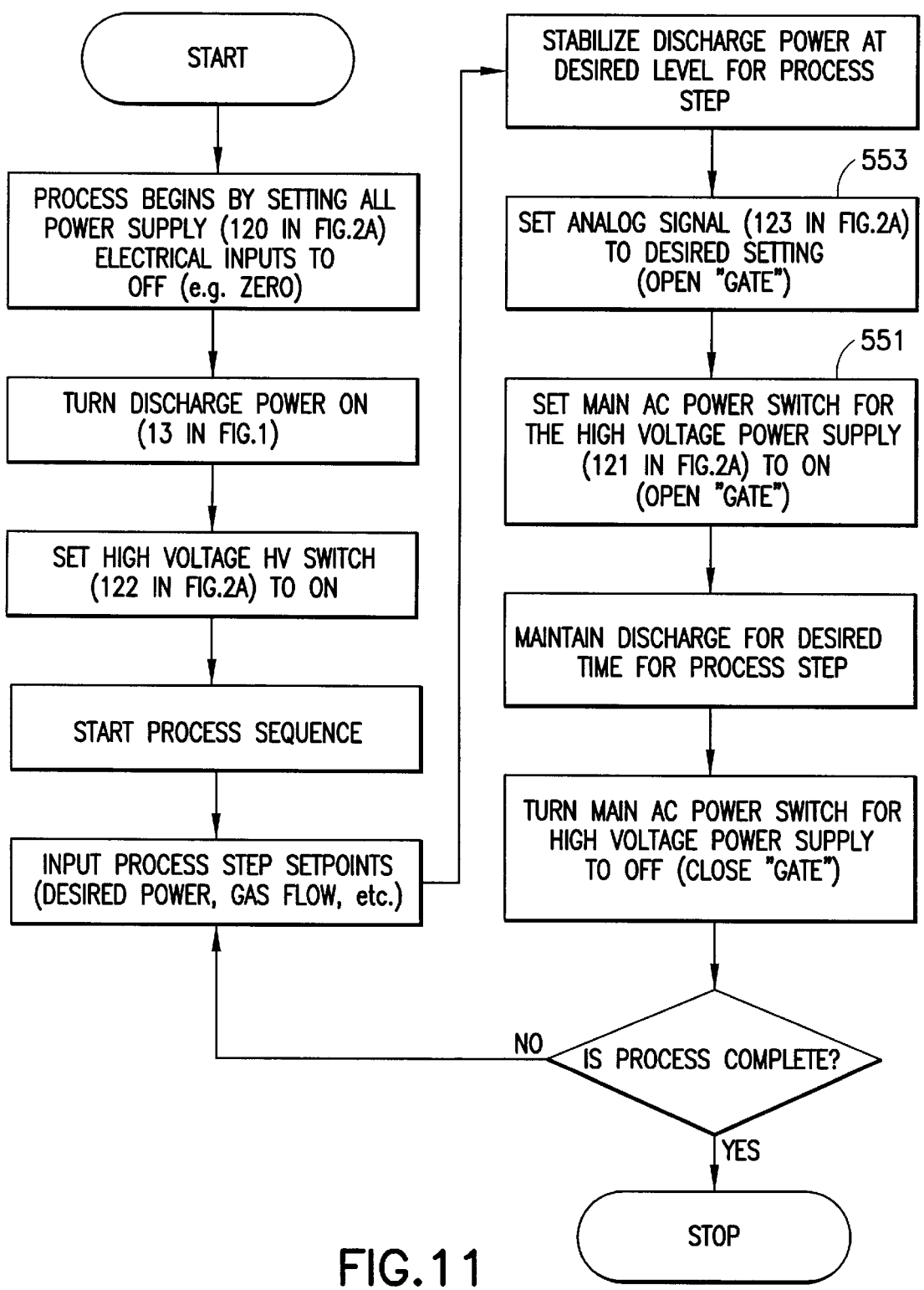
FIG. 11 depicts the process flow of an electrostatic shutter using the standard control system of FIG. 2B.

Referring to FIGS. 2A and 11, in another embodiment of the process, the main power switch (121 in FIG. 2A) is engaged or turned ON (551 in FIG. 11) after the beam voltage level is set (553 in FIG. 11) by the analog signal (123 in FIG. 2A) and after the HV switch (122 in FIG. 2A) is turned on.

The method of the invention may be carried out with the accelerator (also known as the "suppressor") grid set independent of the beam voltage. Referring to FIG. 3E, in a preferred embodiment of the process, however, for ion source operation, the accelerator voltage is gated on or off simultaneously with the beam voltage (thus requiring a duplicate set of the control circuitry shown in FIG. 2A). Otherwise, when the accelerator grid is negatively charged and the beam voltage is too low for efficient extraction of particles, the ions from the plasma will impinge on the negatively charged grid, often (depending on the accelerator voltage setting) with sufficient energy to sputter the grid, causing erosion of the grid and unnecessary contamination of the system.

In accordance with this invention, the discharge power may be held constant during the entire operation. In a more preferred embodiment of the control method, the discharge is adjusted by a feedback control loop to maintain a constant output, as described previously. To do so in the software in accordance with the present invention with minimal oscillation of the output flux from the source, a bit controlling the feedback loop is turned off when the signal switch (also known as a gate switch) is off and the bit is turned on when the gate switch is on. The discharge power level during the "off" period serves as the initial base power level when the gate switch is turned "on." In one embodiment of the invention illustrated in FIG. 12, the discharge power level may be a nominal power level 1201 which is the same for a given step each time the beam is gated "on." If there is a significant difference 1203 between this nominal base level and the final power level required to obtain the predetermined output flux 6209 during ion beam extraction, an additional time period is added to or subtracted from the predetermined process run time 1207 as required to stabilize the output performance.

Figure 13:
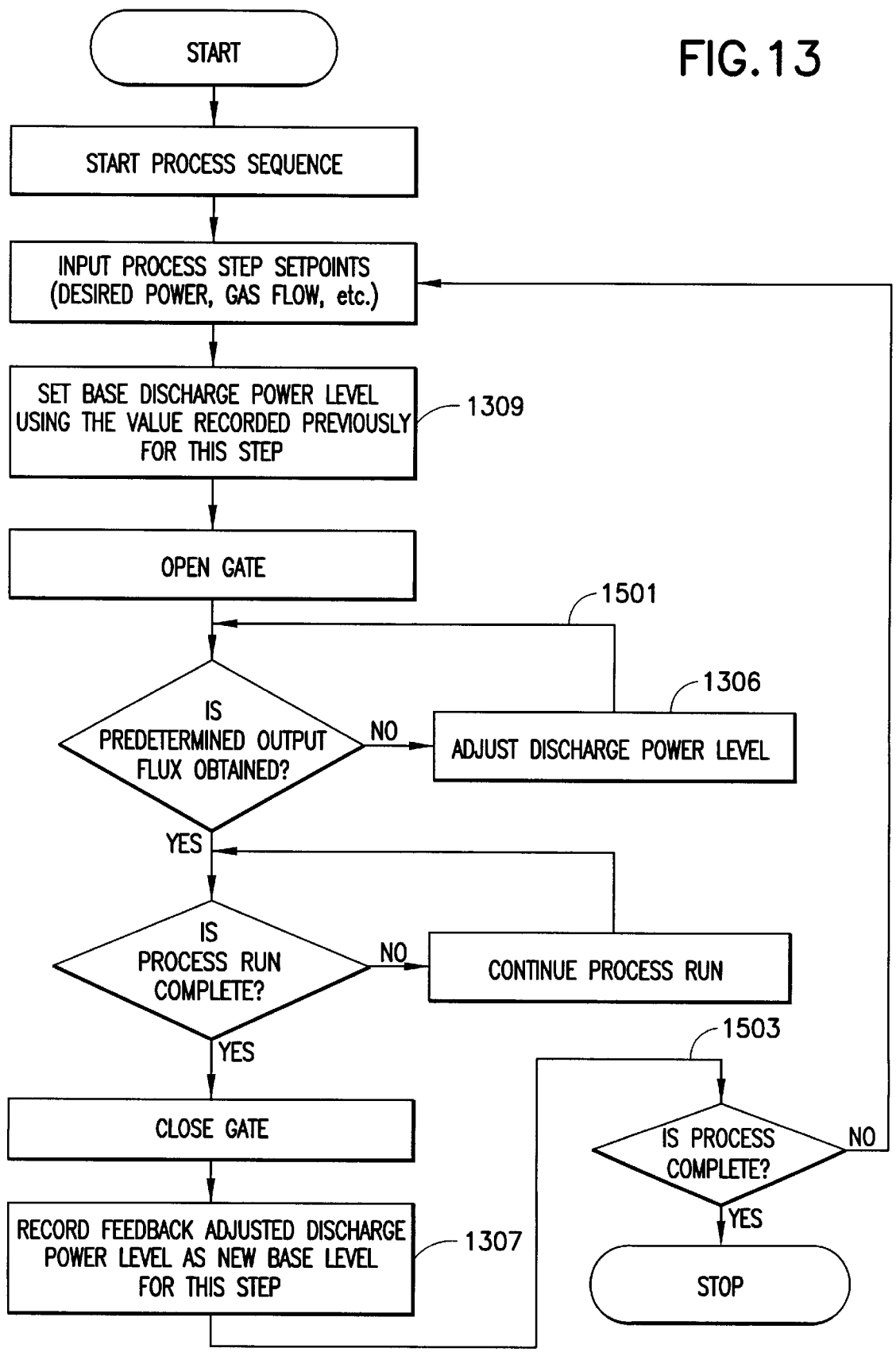
FIG. 13 depicts another method for feedback control.
Figure 14:
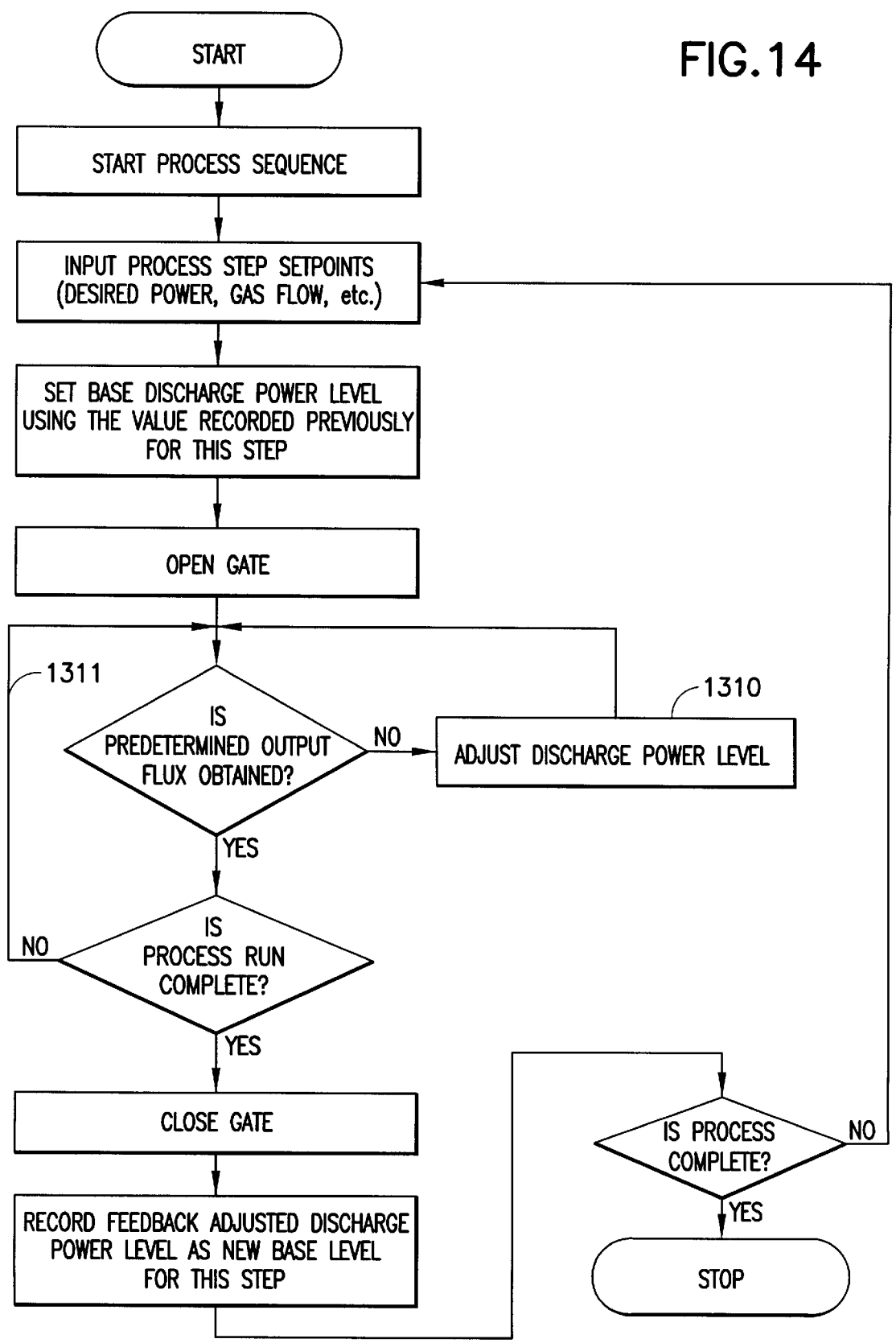
FIG. 14 depicts another method for feedback control.

Referring to FIG. 13, in a more preferable embodiment of the invention, the feedback-adjusted 1306 power level setting established during the previous ion beam extraction period for that step 1307 or during a recently established reference ion beam extraction period is used to set 1309 the base discharge power level between reference periods. In this way, the output of a reasonably stable particle source can be very accurately controlled. Referring to FIG. 14, if the adjustment 1310 is made during substantially all of the ion beam extraction process, for example, the discharge power is continuously "recalibrated."

Figure 12:
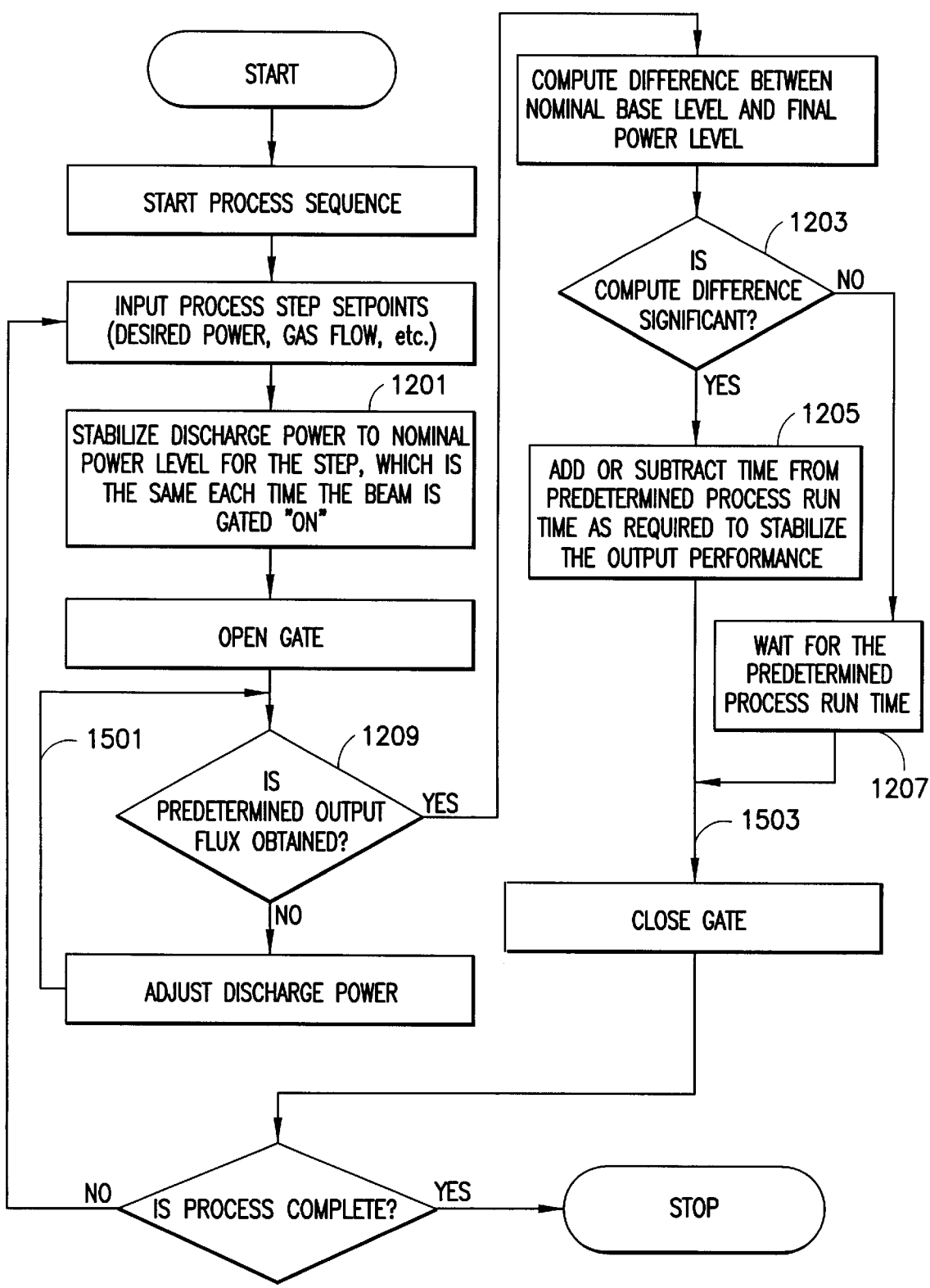
FIG. 12 depicts one method for feedback control.

As thus described and illustrated in FIGS. 12 and 13, the charged particle source is maintained at constant discharge power 1503 during certain periods of time, and is under a feedback control 1501 during other periods of time. The feedback control loop has the benefit of stabilizing the output of the charged-particle source from drift and the constant discharge power has the benefit of stabilizing the output from oscillating during transitionary periods of starting and stopping ion beam extraction.

Switching of the beam voltage by the method of the invention may alternatively be carried out by switching the power supply main power switch indicated as 121 in FIG. 2A "on" or "off". This is not preferable as it would delay the initial "rise time" of the particle flux by the power supply "warm up" time.

Figure 2B:
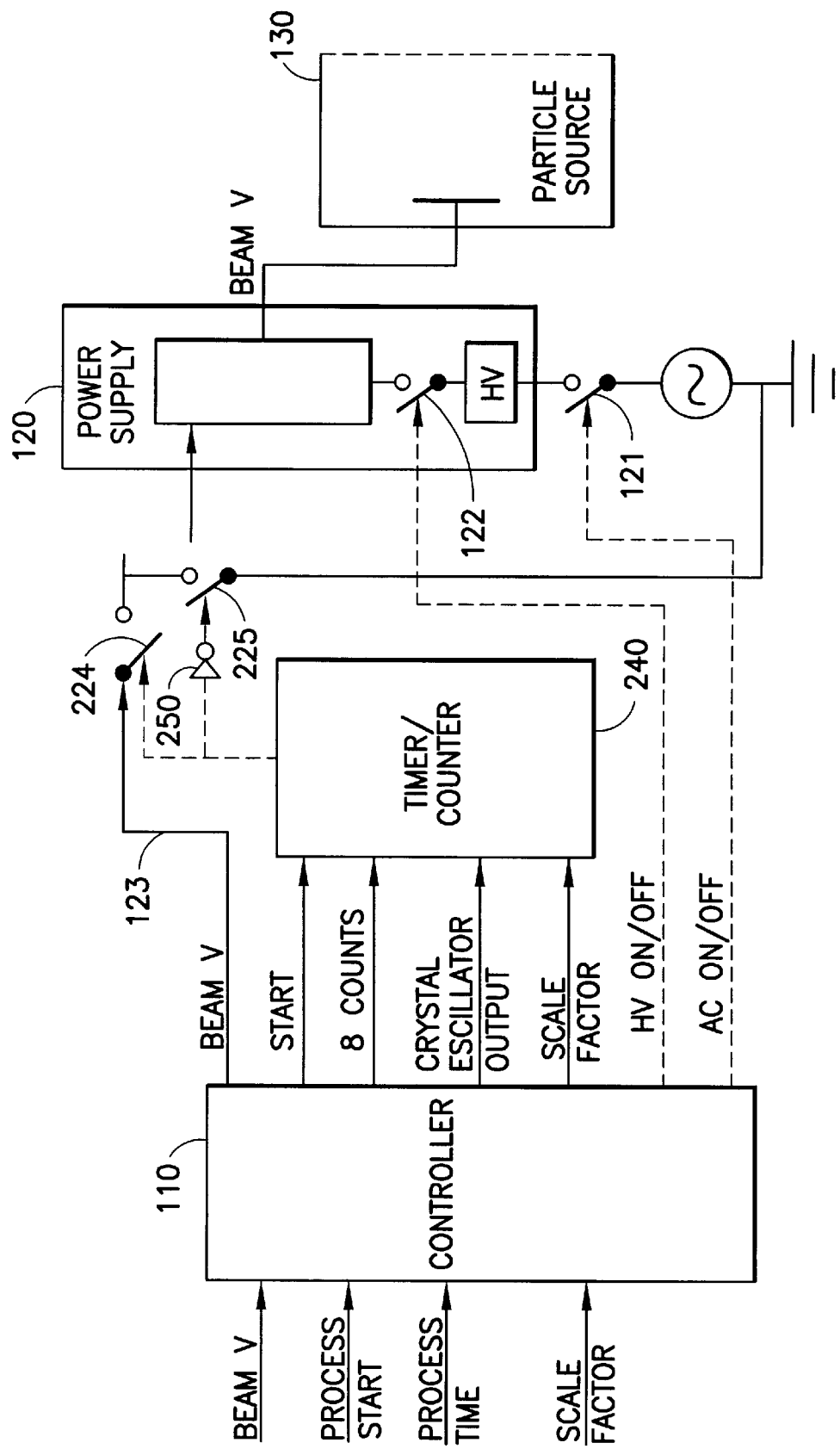
FIG. 2B is a schematic diagram of an enhanced control system for a beam power supply.

In other embodiments of the invention, the control system hardware is optimized with specific hardware to improve the repeatability of the particle extraction process. A low-cost enhanced control system is shown in FIG. 2B. This system differs from the standard control system in FIG. 2A in the addition of the following circuit elements: signal control switch 224, signal ground input control switch 225, timer counter interface module 240, and "NOT" gate (inverter) 250. The signal control switches 224 and 225 are high-speed analog switches, which may be, for example, normally closed. For our purposes, high speed is defined as faster than 2 ms. Such switches are commonly available, for example, the Motorola 74HC4066 analog switching IC. A quad switch 7432, for example, the SN74L532 manufactured by Texas Instruments, can be used to control two pairs of switches for both the beam and accelerator power supplies and is available from most electronics suppliers. The timer counter interface module (240 in FIG. 2B) is, for example, an 8254 model number 05-03927-000A Six Channel Timer Counter Interface Module manufactured by Comark; it is available from most electronics suppliers. The timer counter interface module is described in "TM Timer 05-03927-000A Six Channel Timer Counter Interface Module," published and distributed by Comark Corporation, Medfield, Mass., and is incorporated by reference herein. The timer counter interface module is instructed by the software when to send a start signal to close switch 224. Once the module receives this instruction it begins counting for the specified duration. At the end of this time interval the module will send a stop signal to open switch 224.

In a preferred embodiment of the invention, the timer counter is configured to use the controller computer's crystal oscillator as it base clock. The timer counter interface module incorporates a Programmable Array Logic (PAL) which divides the base clock by two. This resultant clock signal, called "CCLK", is used to create a counter pulse of any frequency between zero and CCLK. This is done by entering a scaling factor through the software. For example, to get a counter pulse frequency of 1 kHz with a CCLK frequency of 7.16 MHz, a scaling factor of 7160 is entered in the software. This counter pulse can be used to generate an output pulse of up to 65,000 counts. For instance, with a counter pulse of 1 kHz, a 40 second-wide output pulse may be generated by instructing the counter to count 40,000 pulses through the software, simply by entering the number 40,000 (# counts). The timer counter interface module may be programmed using "C" code.

The signal ground switch 225, when closed, directly grounds out the input signal to the beam power supply. This is operated in inverse phase to the signal switch 224. When the timer counter interface module sends an output pulse, it is sent to signal switch 224 directly and sent through inverter 250 to ground switch 225. The signal switch 224 closes, sending the voltage setpoint value from the controller computer to the voltage input of the beam power supply. At the same time, the ground switch 225, which was initially closed, grounding the voltage input of the beam power supply, opens. Alternatively, the timer output may be directly connected to the high-speed ground switch and to the signal switch through the inverter. The desired configuration depends upon the polarity of the switches. The inverter 250 is a commonly available electronic component.

Figure 10:
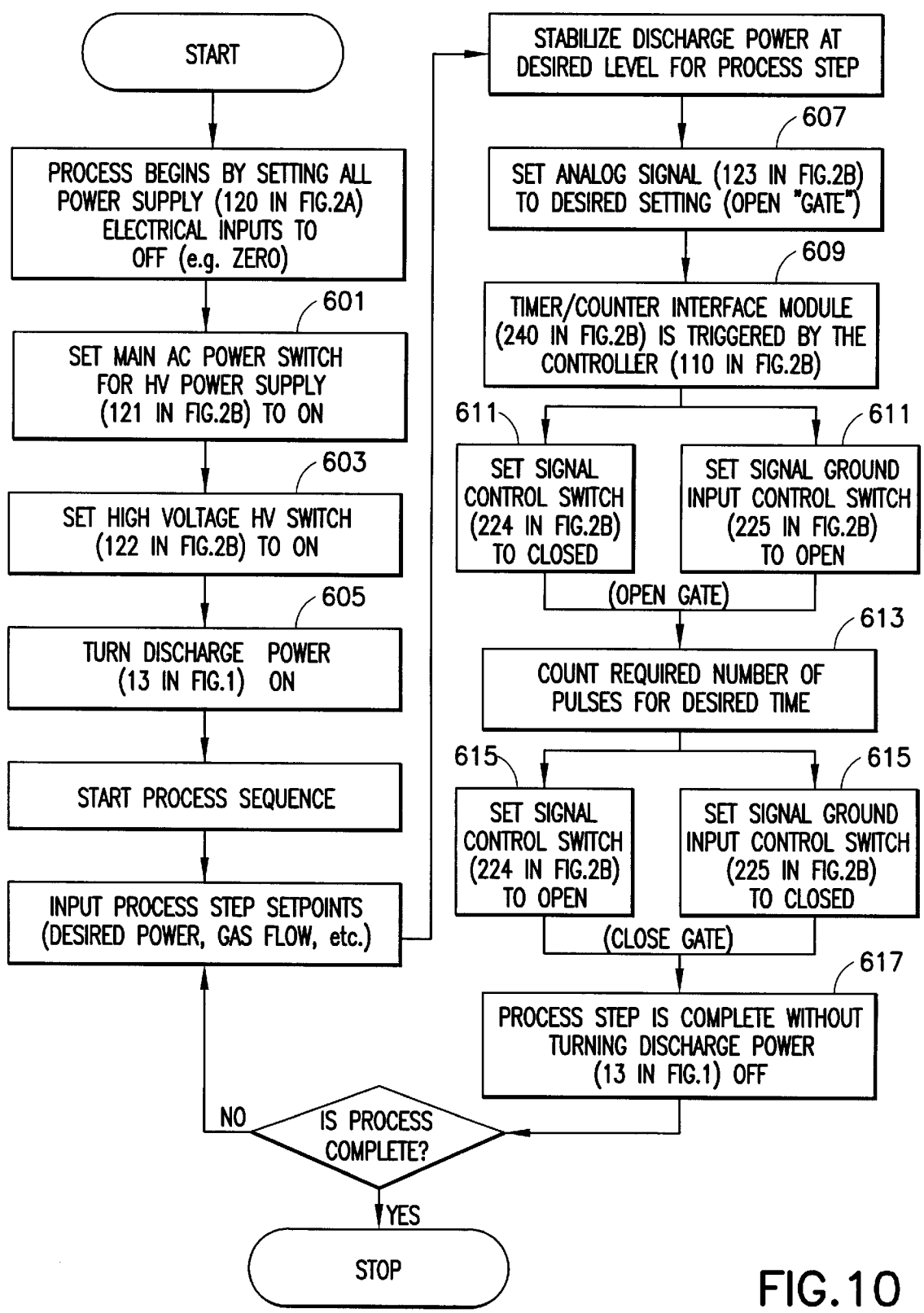
FIG. 10 depicts the process flow for an enhanced control system of FIG. 2B.

Referring to FIGS. 1, 2B and 10, the operation of the enhanced control system is described as follows: the main power (121 in FIG. 2B) and HV power (122 in FIG. 2B) switches to the power supply are turned on (601 and 603 in FIG. 10 respectively), the discharge power (13 in FIG. 1) is turned on (605 in FIG. 10) and stabilized, and the programmed beam voltage signal (123 in FIG. 2B) is output (607 in FIG. 10) from the controller. At this time, there is no energetic charged-particle flux on the target. The beam power supply signal input is directly grounded. When the timer counter interface module (240 in FIG. 2B) is triggered (609 in FIG. 10) by the controller, the beam voltage signal is rapidly transmitted (611 in FIG. 10) to the beam power supply and the power supply ramps up to its setpoint voltage. When the timer counter interface module counts (613 in FIG. 10) the required number of pulses for a complete process it connects (615 in FIG. 10) the input of the power supply to ground and disconnects the program input. At this point the process can be repeated, without turning off the discharge (617 in FIG. 10).

Figure 3C:
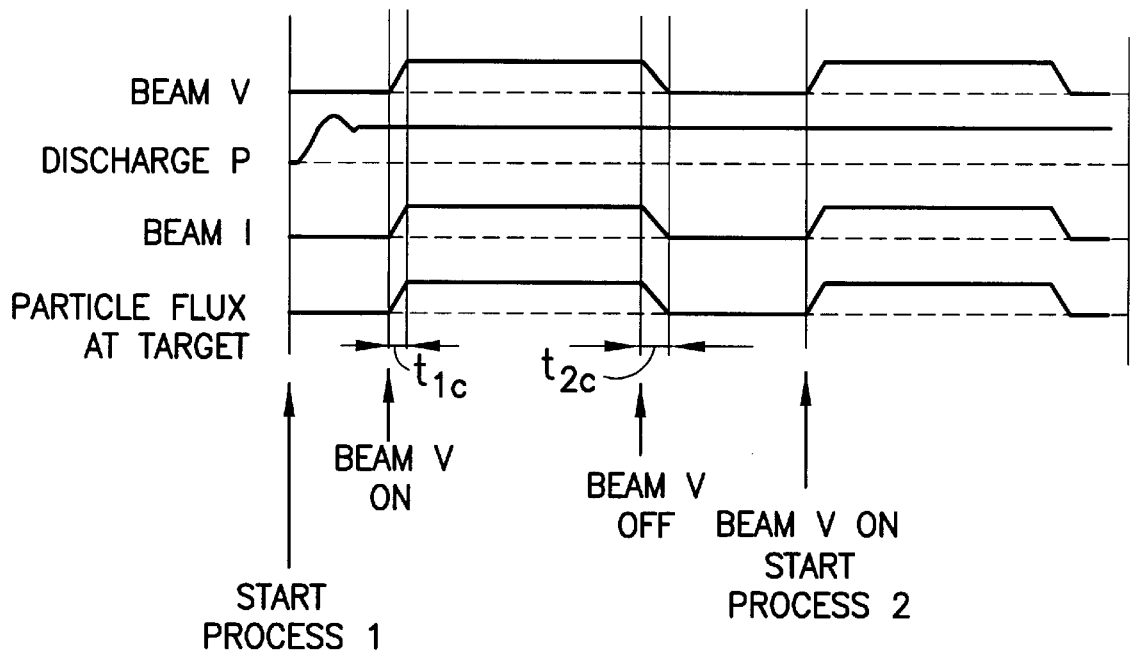
FIG. 3C is a timing diagram illustrating the response of the particle flux collected on the target for particle source operation with an electrostatic shutter operated with a standard control system.
Figure 3D:
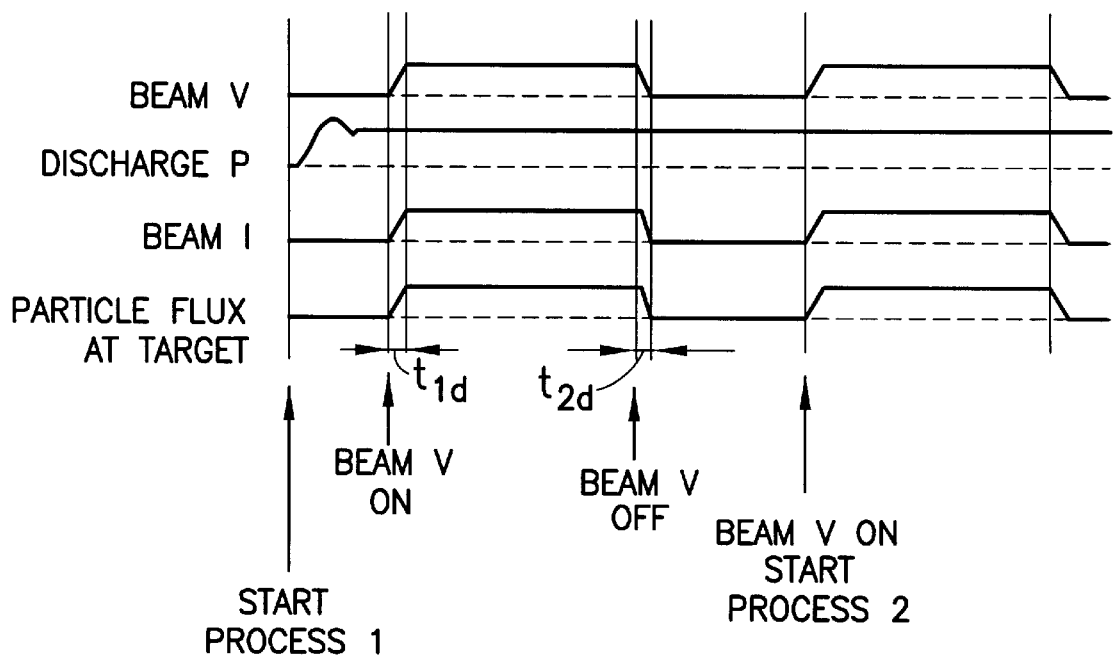
FIG. 3D is a timing diagram illustrating the response of the particle flux collected on the target for particle source operation with an electrostatic shutter operated with the enhanced control system of the present invention.

FIG. 3D shows the particle flux on the target for operation with the enhanced control system according to the invention. The rise time "$t_{1d}$" of the flux on the target is limited by the rise time of the beam power supply, which now can be maintained within 0.1 s. The circuit design has also minimized the decay time "$t_{2d}$" to less than 0.1 s. By immediately grounding the input to the power supply, through the ground input switch 225 and inverter 250 shown in FIG. 2B, capacitive elements which otherwise would delay the signal decay by some RC time constant are shorted out.

The timer counter interface module in the enhanced control system shown in FIG. 2B was added to improve the accuracy and precision of control of the process duration. As described above, in prior state of the art precision control systems these factors are limited by irreproducible software loops to a tolerance of about 1 s. With the present invention control to 0.01 s is easily achieved.

As illustrated in FIGS. 3C and 3D, after plasma ignition, the discharge power is allowed to become substantially uniform before the beam voltage is turned on (or gated).

Figure 4:
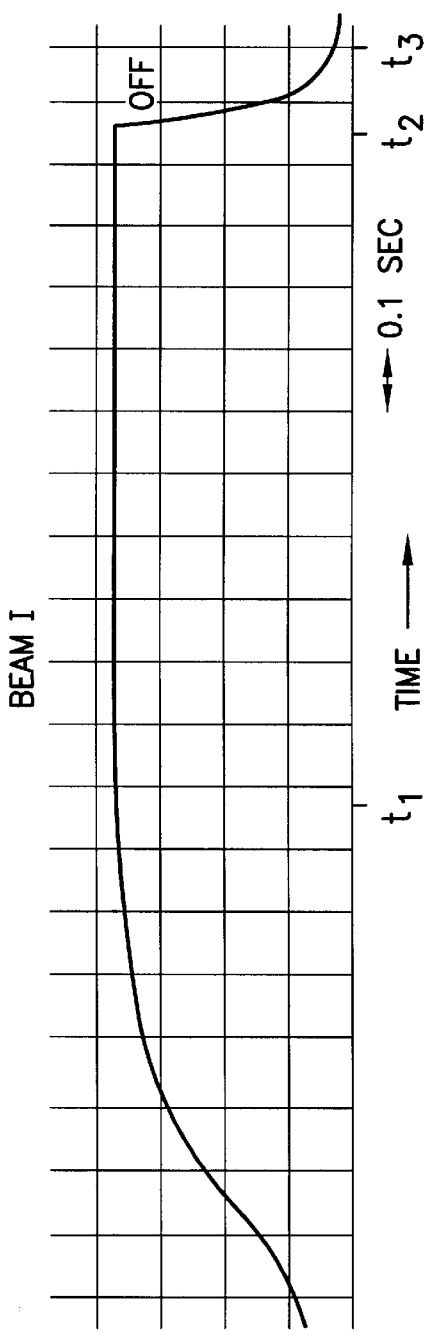
FIG. 4 depicts a trace of a beam current output signal obtained using an electrostatic shutter operated by a standard control system using a high-voltage switch to gate the beam voltage.
Figure 5:
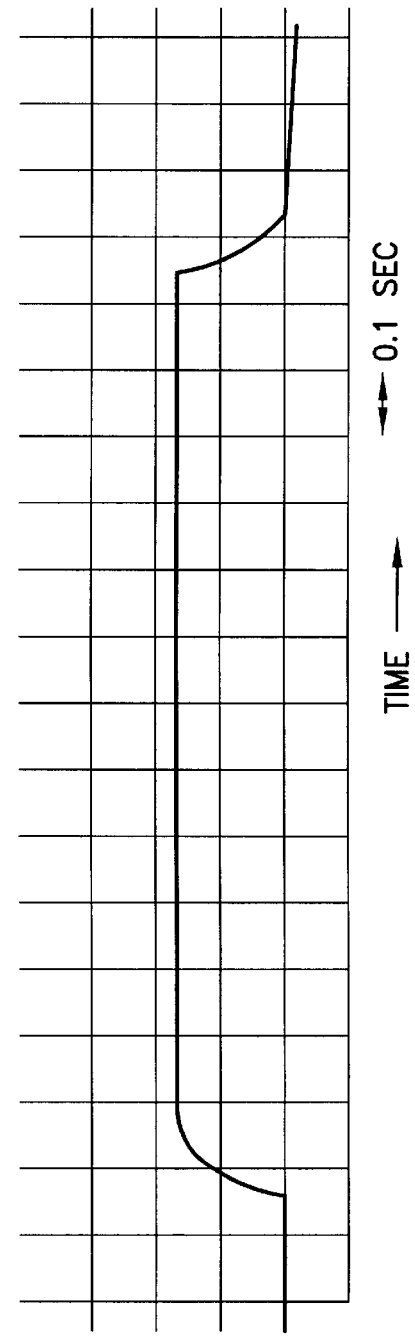
FIG. 5 depicts a trace of a beam current output signal obtained using an electrostatic shutter operated by a standard control system using an analog signal to gate the beam voltage.
Figure 6:
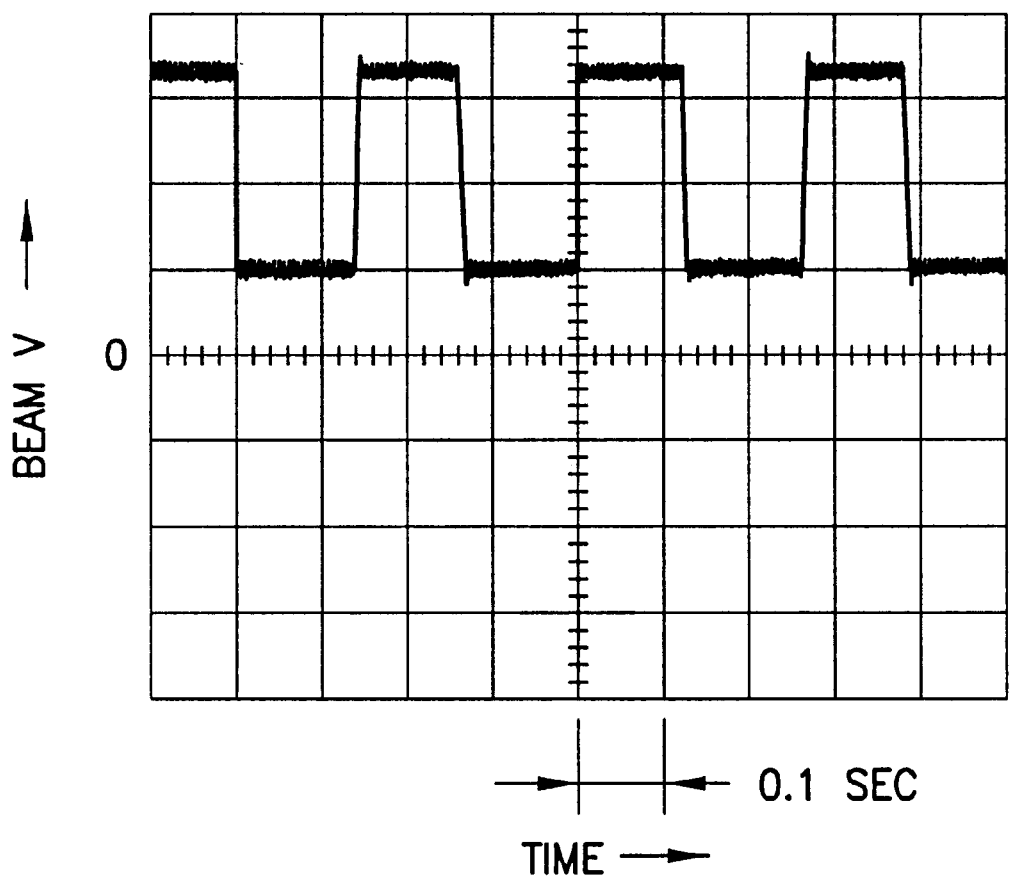
FIG. 6 depicts a trace of a beam current output signal obtained using an electrostatic shutter gated by the enhanced control system of the present invention.

Traces of some actual beam output signals obtained by the method of the invention using the RF inductively coupled ion source with 3 grid ion optics as described in FIG. 1 are shown in FIGS. 4–6. FIGS. 4 and 5 were obtained using the standard control system. The beam voltage was 700 V and the beam current was 350–440 mA. The accelerator voltage was −400V. FIG. 6 was obtained using the enhanced control system with the same parameters. In each of these figures, one large division of the abscissa represents a period of 0.1 sec.

In FIGS. 4 and 5, the current output from the beam power supply is plotted by a chart recorder on the ordinate against time on the abscissa. Since the particle flux is directly proportional to the beam current output, these profiles also represent the flux output profiles.

In FIG. 4, the beam is gated by the high-voltage switch. The beam current signal rises from 0 at t=0, corresponding to the extreme left side of the plot, to a stable level (>97% of full signal) at time "$t_1$." It can be seen that the rise time is approximately 0.9 sec. The beam is shut off at time "$t_2$" and the signal falls back to 0 at time "$t_3$." The fall time is approximately 0.15 sec.

FIG. 5 is a profile of the beam current vs. time in which the beam is gated by the software. Here it can be seen that the signal rise time is about 0.13 sec. The fall time is approximately 0.12 sec.

FIG. 6 is a printout from a high-speed storage oscilloscope of the voltage output from the beam power supply (ordinate) as a function of time (abscissa) obtained using the enhanced control system. As can be seen from reference to FIG. 3D, the output stabilization time is just limited by the stabilization of the beam voltage. Therefore, this profile is also representative of the flux output profile. The signal rise and fall times are clearly less than 20 $\mu$sec (1 small division on the graph).

Although an illustrative embodiment of the present invention, and various modifications thereof, have been described in detail herein with reference to the accompanying drawings, it is to be understood that the invention is not limited to this precise embodiment and described modifications, and that various changes and further modifications may be effected therein by one skilled in the art without departing from the scope or spirit of the invention as defined in the appended claims.

What is claimed is:

1. A method for gating a charged-particle source used for extraction of a charged-particle beam, the method comprising:
   providing a controller operable with a user interface and cooperating with a power supply containing a high-voltage switch, the power supply being connectable to the charged-particle source;
   inputting a specified process time to the controller;
   igniting a plasma in the charged-particle source to a predetermined discharge level; and
   gating the extraction of the charged-particle beam with an output of the controller, wherein the plasma is ignited and the discharge level becomes substantially uniform before said gating, and wherein the controller sets beam voltage after igniting the plasma.

2. The method of claim 1 wherein the gating is accomplished by applying a voltage to a grid.

3. The method of claim 1 wherein the gating is accomplished by a voltage applied to ion optics.

4. The method of claim 1 wherein the charged-particle source comprises a Kaufman source.

5. The method of claim 1 wherein the charged-particle source comprises an inductively coupled RF source.

6. The method of claim 1 additionally comprising providing a feedback control loop between the controller and the charged-particle source, the feedback control loop stabilizing an output of the particle source.

7. The method of claim 6 in which the charged-particle source is maintained at constant discharge power during certain periods of time and a under feedback control during other periods of time, the feedback control loop adjusting the discharge level to stabilize the output of the charged-particle source from drift, the constant discharge power stabilizing the output from oscillating during transitionary periods of starting and stopping charged particle beam extraction.

8. The method of claim 7 in which the feedback control loop is active during substantially all periods of charged particle beam extraction.

9. The method of claim 7 in which the feedback control loop is active for a first reference period of charged particle beam extraction, with a setpoint of the discharge power supply being adjusted by the feedback control loop to obtain a predetermined output, the discharge power level being maintained until a second reference period.

10. The method of claim 1 wherein the charged-particle source comprises a broad-beam electron source.

11. The method of claim 1 wherein the charged-particle source comprises a negative ion source.

12. The method of claim 1 wherein the charged-particle source comprises a gridless source.

13. A method for gating a charged-particle source used for extraction of a charged-particle beam, the method comprising:
   providing a controller operable with a user interface and cooperating with a power supply containing a high-voltage switch, the power supply being connectable to the charged-particle source;
   inputting a specified process time to the controller;
   igniting a plasma in the charged-particle source to a predetermined discharge level; and
   gating the extraction of the charged-particle beam with an output of the controller, wherein a power supply main switch is provided and wherein the main switch is engaged after the controller sets a beam voltage level.

14. A method for gating a charged-particle source used for extraction of a charged-particle beam, the method comprising:
   providing a controller operable with a user interface and cooperating with a power supply containing a high-voltage switch, the power supply being connectable to the charged-particle source;
   inputting a specified process time to the controller;
   igniting a plasma in the charged-particle source to a predetermined discharge level; and
   gating the extraction of the charged-particle beam with an output or the controller, wherein the plasma is ignited and the discharge level becomes substantially uniform before said gating and wherein the charged-particle source contains a screen grid to which a seam voltage is applied and an accelerator grid to which an accelerator voltage is applied, the method additionally comprising gating the accelerator voltage which is applied to the accelerator grid at the same time as said gating the extraction of the charged particle beam.

15. A control system for gating a charged-particle source comprising:
- a timer connectable to a power supply;
- a high-speed analog signal switch engageable with the timer and the power supply;
- a high-speed analog ground switch engageable with the timer and the power supply; and
- an inverter disposed between the timer and the high-speed analog ground switch, said high-speed analog ground switch being directly connectable to ground.

16. A control system for gating a charged-particle source comprising:
- a timer connectable to a power supply;
- a high-speed analog signal switch engageable with the timer and the power supply;
- a high-speed analog ground switch engageable with the timer and the power supply, said high-speed analog ground switch being directly connectable to ground; and
- an inverter disposed between the timer and the high-speed analog signal switch.

17. A method for gating a charged-particle source used for extraction of a charged particle beam, the method comprising:
- providing a controller operable with a user interface and cooperating with a power supply containing a high-voltage switch, the power supply being connectable to the charged particle source;
- inputting a specified process time to the controller;
- igniting a plasma in the charged particle source to a predetermined discharge level; and
- gating the extraction of the charged particle beam with an output of the controller, wherein the plasma is ignited and the discharge level becomes substantially uniform before said gating, and wherein gating the extraction is accomplished by controlling the potential of the plasma.

18. A method for gating a charged-particle source used for extraction of a charged-particle beam, the method comprising:
- providing a controller operable with a user interface and cooperating with a power supply containing a high-voltage switch, the power supply being connectable to the charged-particle source;
- inputting a specified process time to the controller;
- igniting a plasma in the charged-particle source to a predetermined discharge level; and
- gating the extraction of the charged-particle beam with an output of the controller, wherein the gating is accomplished by controlling the potential of the plasma.

19. A radio-frequency (RF) charged-particle source for ion beam extraction, the source comprising:
- a plasma discharge vessel;
- a gas inlet;
- an RF energy generator;
- an ion optics assembly;
- a control system for gating the RF source including:
  - a timer connectable to a power supply;
  - a high-speed analog signal switch engageable with the timer and the power supply;
  - a high-speed analog ground switch engageable with the timer and the power supply, said high-speed analog ground switch being directly connectable to ground; and
  - an inverter disposed between the timer and the high-speed analog signal switch.

20. A radio-frequency (RF) charged-particle source for ion beam extraction, the source comprising:
- a plasma discharge vessel;
- a gas inlet;
- an RF energy generator;
- an ion optics assembly;
- a control system for gating the RF source including:
  - a timer connectable to a power supply;
  - a high-speed analog signal switch engageable with the timer and the power supply;
  - a high-speed analog ground switch engageable with the timer and the power supply; and
  - an inverter disposed between the timer and the high-speed analog ground switch, said high-speed analog ground switch being directly connectable to ground.

* * * * *

UNITED STATES PATENT AND TRADEMARK OFFICE
CERTIFICATE OF CORRECTION

PATENT NO. : 6,225,747 B1
DATED : May 1, 2001
INVENTOR(S) : Fremgen, Jr. et al.

It is certified that error appears in the above-identified patent and that said Letters Patent is hereby corrected as shown below:

<u>Column 12, claim 14,</u>
Line 59, "output or the" should read -- output of the --.
Line 62, "a seam voltage" should read -- a beam voltage --.

Signed and Sealed this

Twenty-sixth Day of February, 2002

*Attest:*

*Attesting Officer*

JAMES E. ROGAN
*Director of the United States Patent and Trademark Office*